US012660271B2

(12) United States Patent
Gandikota et al.

(10) Patent No.: US 12,660,271 B2
(45) Date of Patent: Jun. 16, 2026

(54) METHOD OF REDUCING METAL GATE RESISTANCE FOR NEXT GENERATION NMOS DEVICE APPLICATION

(71) Applicant: Applied Materials, Inc., Santa Clara, CA (US)

(72) Inventors: Srinivas Gandikota, Santa Clara, CA (US); Yixiong Yang, Fremont, CA (US); Yongjing Lin, San Jose, CA (US); Tuerxun Ailihumaer, Santa Clara, CA (US); Tengzhou Ma, San Jose, CA (US); Yuanhua Zheng, Burlingame, CA (US); Zhihui Liu, Sunnyvale, CA (US); Shih Chung Chen, Cupertino, CA (US); Janardhan Devrajan, Santa Clara, CA (US); Yi Xu, San Jose, CA (US); Yu Lei, Belmont, CA (US); Mandyam Sriram, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 585 days.

(21) Appl. No.: 18/067,979

(22) Filed: Dec. 19, 2022

(65) Prior Publication Data

US 2024/0204061 A1      Jun. 20, 2024

(51) Int. Cl.
| | |
|---|---|
| *H10D 64/01* | (2025.01) |
| *H10D 30/67* | (2025.01) |
| *H10D 64/66* | (2025.01) |
| *H10P 14/40* | (2026.01) |
| *H10P 14/43* | (2026.01) |

(52) U.S. Cl.
CPC ......... *H10D 64/01* (2025.01); *H10D 30/6735* (2025.01); *H10D 64/0113* (2026.01); *H10D 64/662* (2025.01); *H10D 64/667* (2025.01); *H10P 14/418* (2026.01); *H10P 14/43* (2026.01)

(58) Field of Classification Search
None
See application file for complete search history.

(56) References Cited

U.S. PATENT DOCUMENTS

| | | | |
|---|---|---|---|
| 5,789,312 A | 8/1998 | Buchanan et al. | |
| 8,039,391 B1* | 10/2011 | Yin ................... | H01L 21/28518 257/757 |
| 11,404,416 B2 | 8/2022 | Khaderbad et al. | |
| 2005/0106865 A1* | 5/2005 | Chung .............. | C23C 16/45504 438/680 |
| 2015/0263004 A1 | 9/2015 | Cheon et al. | |
| 2016/0204218 A1* | 7/2016 | Grass ................... | H10D 64/667 257/288 |

(Continued)

OTHER PUBLICATIONS

Buchanan, Douglas A., et al., "Fabrication of midgap metal gates compatible with ultrathin dielectrics", Applied Physics Letters, vol. 73, No. 12, Sep. 21, 1998.

*Primary Examiner* — Alexander G Ghyka
(74) *Attorney, Agent, or Firm* — SERVILLA WHITNEY LLC

(57) ABSTRACT

Methods of manufacturing and processing semiconductor devices (i.e., electronic devices) are described. Embodiments of the disclosure advantageously provide methods to reduce the resistance of the work function layer of an electronic device, as well as using a low resistivity metal for filling the gate.

14 Claims, 4 Drawing Sheets

(56)                         References Cited

U.S. PATENT DOCUMENTS

2017/0053915 A1*  2/2017  Ando  ................ H01L 21/28255
2017/0110375 A1*  4/2017  Bao  ...................... H10D 84/038
2017/0117179 A1*  4/2017  Koschinsky  ...... H01L 21/76879
2022/0165852 A1   5/2022  Gandikota et al.

* cited by examiner

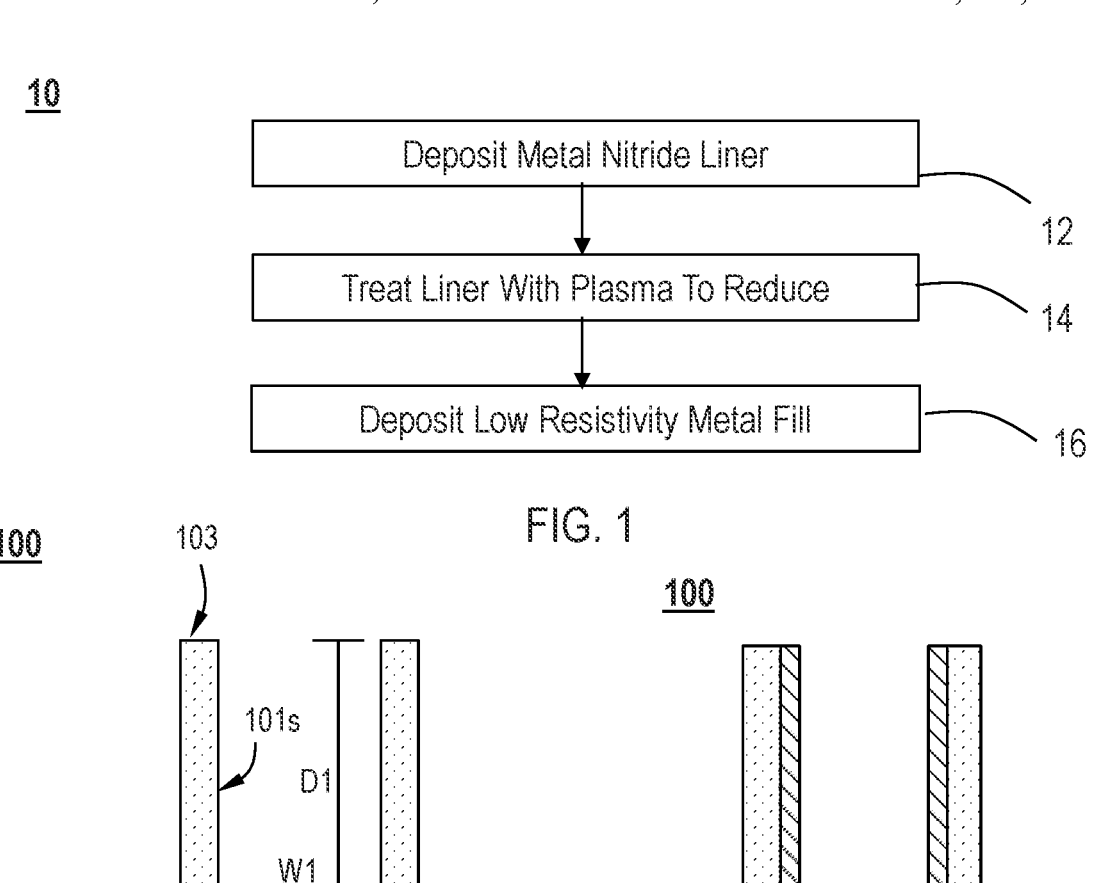
FIG. 1
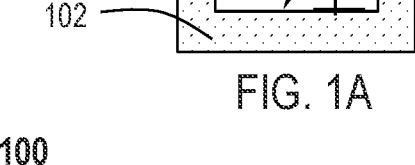
FIG. 1A
FIG. 1B
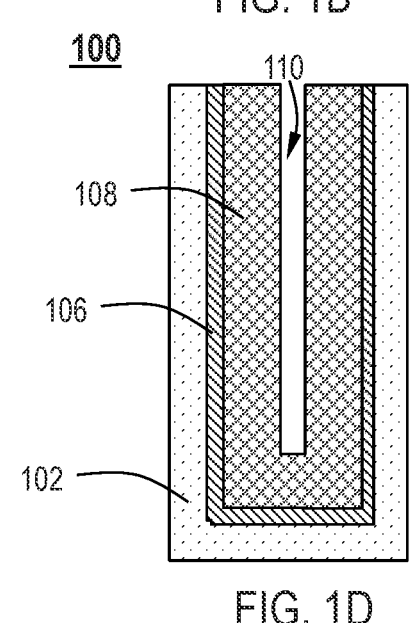
FIG. 1C
FIG. 1D

20

| Deposit Liner | 22 |

↓

| Etch Back a Portion of Liner | 24 |

↓

| Deposit Low Resistivity Metal Fill | 26 |

METHOD OF REDUCING METAL GATE RESISTANCE FOR NEXT GENERATION NMOS DEVICE APPLICATION

TECHNICAL FIELD

Embodiments of the present disclosure pertain to the field of electronic device manufacturing and, in particular, to transistors. More particularly, embodiments of the disclosure are directed to gate-all-around (GAA) devices and methods of manufacturing GAA devices with reduced gate resistance.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. Integrated circuits incorporate planar field-effect transistors (FETs) in which current flows through a semiconducting channel between a source and a drain, in response to a voltage applied to a control gate.

The rapid growth of mobile devices and machine learning are demanding greater transistor performance with lower power consumption. This requires the continuation of Moore's Law to shrink the size of transistor and double its density on a chip. One of the key challenges of transistor technology is to reduce metal gate resistance while shrinking the transistor especially, in gate-all-around structures (GAA). The current approach of using existing n- or p-metal layers combined with dipole leads to high gate resistance. Such high gate resistances can lead to degradation of device performance.

Accordingly, there is a need for new and improved methods of forming gate-all-around structures that have reduced metal gate resistance.

SUMMARY

One or more embodiments of the disclosure are directed to methods of reducing gate resistance in an NMOS device. In one or more embodiments, the method comprises: conformally depositing a metal nitride layer on a metal gate stack; treating the metal nitride layer with a plasma to form a reduced metal nitride layer; and depositing a low resistivity metal fill on the reduce metal nitride layer.

Additional embodiments of the disclosure are directed to methods of reducing gate resistance in an NMOS device. In one or more embodiments. the method comprises: depositing a liner layer on a metal gate stack; removing a portion of the liner layer; and depositing a low resistivity metal fill on the liner layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 1 depicts a process flow diagram of one embodiment of a method according to one or more embodiments described herein;

FIG. 1A illustrates a cross-sectional view of an electronic device according to one or more embodiments;

FIG. 1B illustrates a cross-sectional view of an electronic device according to one or more embodiments;

FIG. 1C illustrates a cross-sectional view of an electronic device according to one or more embodiments;

FIG. 1D illustrates a cross-sectional view of an electronic device according to one or more embodiments;

FIG. 2 depicts a process flow diagram of one embodiment of a method according to one or more embodiments described herein;

FIG. 2A illustrates a cross-sectional view of an electronic device according to one or more embodiments;

FIG. 2B illustrates a cross-sectional view of an electronic device according to one or more embodiments;

FIG. 2C illustrates a cross-sectional view of an electronic device according to one or more embodiments;

FIG. 2D illustrates a cross-sectional view of an electronic device according to one or more embodiments;

DETAILED DESCRIPTION

Figures 3, 3A, 3B, 3C, 3D:
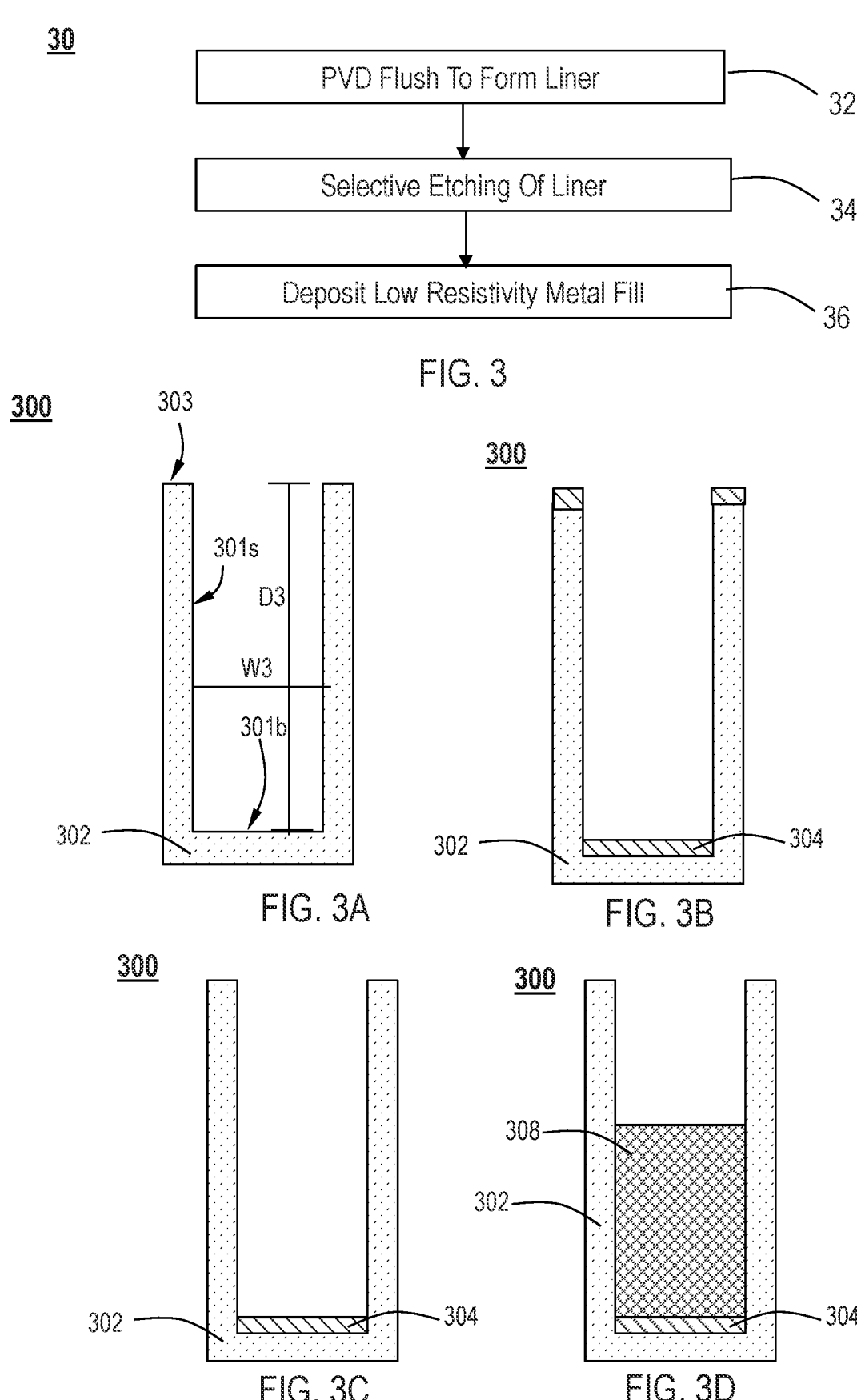
FIG. 3 depicts a process flow diagram of one embodiment of a method according to one or more embodiments described herein.
FIG. 3A illustrates a cross-sectional view of an electronic device according to one or more embodiments.
FIG. 3B illustrates a cross-sectional view of an electronic device according to one or more embodiments.
FIG. 3C illustrates a cross-sectional view of an electronic device according to one or more embodiments.
FIG. 3D illustrates a cross-sectional view of an electronic device according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "on" indicates that there is direct contact between elements. The term "directly on" indicates that there is direct contact between elements with no intervening elements.

As used in this specification and the appended claims, the terms "precursor," "reactant," "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Field effect transistors are voltage-controlled devices where its current carrying ability is changed by applying an electric field. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated IS and current entering the channel at the drain (D) is designated ID. Drain-to-source voltage is designated VDS. By applying voltage to gate (G), the current entering the channel at the drain (i.e., ID) can be controlled.

The metal-oxide-semiconductor field-effect transistor (MOSFET) is a type of field-effect transistor (FET) and is used in integrated circuits and high-speed switching applications. MOSFET has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p-type substrate region. If the MOSFET is a p-channel or pMOS FET, then the source and drain are p+ regions and the body is a n-type substrate region. The source is so named because it is the source of the charge carriers (electrons for n-channel, holes for p-channel) that flow through the channel; similarly, the drain is where the charge carriers leave the channel.

A nMOS FET, is made up of a n-type source and drain and a p-type substrate. When a voltage is applied to the gate, holes in the body (p-type substrate) are driven away from the gate. This allows forming an n-type channel between the source and the drain and a current is carried by electrons from source to the drain through an induced n-type channel. Logic gates and other digital devices implemented using NMOSs are said to have NMOS logic. There are three modes of operation in a NMOS called the cut-off, triode, and saturation. Circuits with NMOS logic gates dissipate static power when the circuit is idling, since DC current flows through the logic gate when the output is low.

A pMOS FET is made up of p-type source and drain and a n-type substrate. When a positive voltage is applied between the source and the gate (negative voltage between gate and source), a p-type channel is formed between the source and the drain with opposite polarities. A current is carried by holes from source to the drain through an induced p-type channel. A high voltage on the gate will cause a PMOS not to conduct, while a low voltage on the gate will cause it to conduct. Logic gates and other digital devices implemented using PMOS are said have PMOS logic. PMOS technology is low cost and has a good noise immunity.

In a NMOS, carriers are electrons, while in a PMOS, carriers are holes. When a high voltage is applied to the gate, NMOS will conduct, while PMOS will not. Furthermore, when a low voltage is applied in the gate, NMOS will not conduct and PMOS will conduct. NMOS are considered to be faster than PMOS, since the carriers in NMOS, which are electrons, travel twice as fast as holes, which are the carriers in PMOS. But PMOS devices are more immune to noise than NMOS devices. Furthermore, NMOS ICs would be smaller than PMOS ICs (that give the same functionality), since the NMOS can provide one-half of the impedance provided by a PMOS (which has the same geometry and operating conditions).

As used herein, the term "fin field-effect transistor (Fin-FET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nano-wires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nano-structure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm, or from 0.5 nm to 500 nm, or from 0.5 nm to 100 nm, or from 1 nm to 500 nm, or from 1 nm to 100 nm, or from 1 nm to 50 nm.

One or more embodiments provide the development of a new integration scheme to advantageously reduce the gate resistance reducing the resistance of the work function metal layer as well as using a low resistivity metal for gate fill in order to achieve desired work function and a low-resistance metal gate. In current transistors, the P work function metal typically uses metal nitride or carbide, such as TiN, MON, MoCN, WN, WCN, TiC or TaC. These metal nitride and carbide materials typically suffer from high resistivity because of Cl or C residue. To effectively reduce the resistance, in one or more embodiments, a treatment method, such as radical treatment to remove Cl or C residue, may be advantageously used. Similarly, current N work function metals use materials such as TiAlC, TaAlC, TaSiAlC, TiSiAlC or Hf$_2$C. These carbide materials have high resistivity due to the presence of carbon. To reduce the resistance, in one or more embodiments, a treatment method, such as radical treatment to remove C residue, may be advantageously used. This treatment can remove either carbon on the surface of the film or in the entire film.

Oxidation of work function materials also leads to higher resistance especially for thinner films. To address this issue, in one or more embodiments, the work function materials are advantageously capped with a thin layer of amorphous silicon (Si), which prevents oxidation of the work function layer and significantly improves the conductivity. In one or more embodiments, amorphous silicon may be deposited by atomic layer deposition with a precursor selected from SiH$_4$ or Si$_2$H$_6$, Si$_3$H$_8$, Si$_4$H$_{10}$ to achieve high conformality.

As used herein, the term "conformal" means that the layer adapts to the contours of a feature or a layer. Conformality of a layer is typically quantified by a ratio of the average thickness of a layer deposited on the sidewalls of a feature to the average thickness of the same deposited layer on the field, or upper surface, of the substrate.

In one or more embodiments, using a low resistivity metal to fill the gate stack after work function metal deposition is key to achieving reduced gate stack resistance. With current GAA structures, the space of the metal gate trench is about 15 nm to 25 nm. As dimensions decrease, it is important to choose the metal with the appropriate electron mean free path for low resistivity. For example, the electron mean free path is 15 nm for tungsten (W), 11 nm for molybdenum (Mo), and 8 nm for ruthenium (Ru). In one or more embodiments, Mo and Ru can be used as an improved gate fill metal to achieve lower resistivity.

In one or more embodiments, the lower resistivity gate stack fill can be advantageously achieved by using a conformal liner and a low resistivity metal. In one or more embodiments, the liner can be any suitable liner material known to the skilled artisan. In some embodiments, the liner can include, but is not limited to, one or more of titanium nitride (TiN), titanium silicon nitride (TiSiN), titanium nitride with amorphous silicon (TiN+a-Si), titanium aluminum carbide (TiAlC) with a self-limiting layer comprising a material such as aluminum (Al) or silicon (Si), titanium aluminum nitride (TiAlN), tungsten nitride (WN), molybdenum nitride (MoN), and tantalum nitride (TaN). In one or more embodiments, the low resistivity metal can be any suitable metal known to the skilled artisan. In one or more embodiments, the low resistivity metal can include, but is not limited to, one or more of tungsten (W), molybdenum (Mo), ruthenium (Ru), cobalt (Co), and aluminum (Al).

In one or more embodiments, the conformal liner and low resistivity metal can be deposited by any suitable means. In some embodiments, the conformal liner and low resistivity metal can be deposited by vapor deposition such as atomic layer deposition (ALD) or chemical vapor deposition (CVD).

In one or more embodiments, for W deposition, the precursor can be any suitable precursor known to the skill artisan. In one or more embodiments, the W precursor can include, but is not limited to, tungsten (IV) chloride ($WCl_4$), tungsten (V) chloride ($W_2Cl_{10}$), tungsten fluoride (WF), tungsten hexacarbonyl ($W(CO)_6$), tungsten (VI) oxychloride ($WOCl_4$), and the like. In one or more embodiments, for Mo deposition, the precursor can be any suitable precursor known to the skill artisan. In one or more embodiments, the Mo precursor can include, but is not limited to, molybdenum (V) chloride ($MoCl_5$), molybdenum oxytetrachloride ($MoOCl_4$), molybdenum dichloride dioxide ($MoO_2Cl_2$), molybdenum hexafluoride ($MoF_6$), molybdenum carbonyl ($Mo(CO)_6$), and the like. In one or more embodiments, for Ru deposition, the precursor can be any suitable precursor known to the skill artisan. In one or more embodiments, the Ru precursor can include, but is not limited to, Ru (cycloheptadieny)2, Tricarbonyl(trimethylenemethane)ruthenium), (Tris-beta-diketonates)Ru, and the like. In one or more embodiments, for Co deposition, the precursor can be any suitable precursor known to the skill artisan. In one or more embodiments, the Co precursor can include, but is not limited to, (3,3-Dimethyl-1-butyne)dicobalt hexacarbonyl (CCTBA), Bis-cyclopentadienyl cobalt, bis(methylcyclopentadienyl)Cobalt or cyclopentadienyl isopropyl acetamindinato cobalt, and the like. In one or more embodiments, for Al deposition, the precursor can be any suitable precursor known to the skill artisan. In one or more embodiments, the Al precursor can include, but is not limited to, dimethyl aluminum hydride (DMAH), trimethylaluminum ($Al_2(CH_3)_6$), triethylaluminum ($Al_2(C_2H_5)_6$), 1-methylpyrrolidine alane ($H_3AlN(CH_3)C_4H_8$), trimethylaminealane borane, tritertbutylaluminum, aluminum hydride, dimethylethylaminealane, and the like. In one or more embodiments, the Al deposition process can be the decomposition of a single Al precursor or a combination of multiple precursors, such as aluminum chloride and aluminum hydride.

In one or more embodiments, a key to achieving a gate stack fill with low resistivity metal for a working device is to have minimum void during the gate fill. In one or more embodiments, an aluminum (Al) or cobalt (Co) film with reflow capability grown above 400° C. to achieve a void free gate stack fill. In one or more embodiments, the gate stack can be filled with a combination of a liner and Al, or a liner and W/Mo/Ru and Al/Co.

In other embodiments, another approach to achieving gate stack fill is by bottom-up growth and/or bottom-up gap fill. In one or more embodiments bottom-up growth of a low resistivity metal can be achieved by methods such as liner etch back or PVD flush process before the deposition of the low resistivity metal. In one or more embodiments, a uniform liner can be deposited after the work function metal deposition. After selectively etching the top portion of the liner, a low resistivity metal can grow only on the bottom portion of the trench due to its selectivity growth on the liner. Therefore, a bottom-up growth can be achieved with no void observed. In one or more embodiments, another approach is to use PVD flush to achieve selectivity. In one or more embodiments, a metal layer can be deposited by PVD. Due to the directionality of PVD, the metal layer is only deposited on the bottom and field area of trench. After removing the metal on the field area, the low resistivity metal can achieve bottom-up growth with no void.

In yet further embodiments, the resistance of the gate stack can be improved by combining metal growth with plasma treatment. In one or more embodiments, to improve the gate fill performance of the low resistivity metal, a radical treatment can be applied on the liner metal nitride to form a metallic surface to improve the growth of low resistivity metal film.

In one or more embodiments, there are multiple approaches to deposit a low resistivity metal with desired performance. In an embodiment, the low resistivity metal can be deposited by a thermal process such as ALD or CVD process. In another embodiment, the low resistivity metal can be deposited with a plasma assisted process to fill the metal gate. In another embodiment, a cyclic deposition and treatment process, where a film is deposited and then treated followed by deposition and treatment of an additional film, and an etch process can be used to achieve low chloride (Cl) or carbon (C) content and void free fill.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1 depicts a process flow diagram of a method 10 of manufacturing an electronic device in accordance with one or more embodiments of the present disclosure. FIGS. 1A to 1D are cross-section views of an electronic device being processed in accordance with the method of FIG. 1. With reference to FIG. 1, the method 10 begins at operation 12 by depositing a metal nitride liner on a gate stack. At operation 14, the liner is treated with a plasma to reduce the liner. At operation 16, a low resistivity metal fill is deposited in the trench.

With reference to FIG. 1A, a substrate 102 is provided. As used in this specification and the appended claims, the term "provided" means that the substrate or substrate surface is made available for processing (e.g., positioned in a processing chamber). The substrate 102 may be any suitable material known to the skilled artisan. In one or more embodiments, the substrate 102 comprises one or more of an N-dipole gate stack or a P-dipole gate stack.

The semiconductor substrate 102 can be any suitable substrate material. In one or more embodiments, the semiconductor substrate 102 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate 102 comprises one or more of silicon (Si), germanium (Ge), gallium (Ga), arsenic (As), indium (In), phosphorus (P), or selenium (Se). Although a few examples of materials from which the substrate 102 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 102 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

In one or more embodiments, the substrate 102 comprises one or more of an N-dipole gate stack or a P-dipole gate stack. The N-dipole gate stack or a P-dipole gate stack may include one or more of an interfacial layer, a high-κ dielectric layer, an N-metal layer, a P-metal layer, and a capping layer.

Referring to FIGS. 1A to 1D, a substrate 102 is provided having at least one trench 101 therein. The at least one trench has a bottom 101*b* and sidewall 101*s*. The at least one trench may be formed so as to have a width within a range of about 10 to about 100 nm, including, but not limited to a range of about 10 nm to about 80 nm, about 10 nm to about 70 nm, about 10 nm to about 60 nm, about 10 nm to about 50 nm, or about 10 nm to about 40 nm. As will be recognized by one of skill in the art, the width of the at least one trench is defined by a distance W1 from one sidewall 101*s* to another sidewall 101*s*. The at least one trench 101 may be formed so as to have a depth within a range of about 120 nm to about 250 nm, including, but not limited to a range of about 120 nm to about 150 nm, about 150 nm to about 200 nm, about 200 nm to about 250 nm, about 120 nm to about 200 nm, or about 150 nm to about 250 nm. As will be recognized by one of skill in the art, the depth of the at least one trench 101 is defined by the distance D1 from the substrate surface 103 to the bottom 101*b* of the at least one trench 101.

With reference to FIG. 1 and FIG. 1B, at operation 12, a metal nitride liner 104 is deposited in the at least one trench 101, on the sidewall 101*s* and on the bottom 101*b* of the at least one trench. In one or more embodiments, the metal nitride liner 104 is substantially conformal. As used herein, a layer which is "substantially conformal" refers to a layer where the thickness is about the same throughout (e.g., on the bottom surface and on the sidewall of the at least one trench 101). A layer which is substantially conformal varies in thickness by less than or equal to about 5%, 2%, 1% or 0.5%.

The metal nitride liner 104 may have any suitable thickness known to the skilled artisan. In one or more embodiments, the metal nitride liner 104 has a thickness in a range of from 0.5 nm to 5 nm.

In one or more embodiments, the metal nitride liner 104 may comprise any suitable material known to the skilled artisan. In one or more embodiments, the metal nitride liner 104 comprises one or more of titanium nitride (TiN), titanium silicon nitride (TiSiN), titanium aluminum nitride (TiAlN), tungsten nitride (WN), molybdenum nitride (MoN), and tantalum nitride (TaN). In some embodiments, the metal nitride liner 104 further comprises an amorphous silicon (a-Si) layer.

In one or more embodiments, the metal nitride liner 104 can be deposited by any suitable means. In some embodiments, the metal nitride liner 104 can be deposited by vapor deposition such as atomic layer deposition (ALD) or chemical vapor deposition (CVD).

Referring to FIG. 1 and FIG. 1C, at operation 14, the metal nitride liner 104 is treated with a plasma to reduce the nitrogen present in the liner and form a reduced metal nitride liner 106. In one or more embodiments, the plasma can comprise one or more of argon ($A_r$), nitrogen ($N_2$), or hydrogen ($H_2$).

In one or more embodiments, the plasma may have any suitable flow rate. In one or more embodiments, plasma has a plasma has a flow rate in a range of from 1 sccm to 1000 sccm, or in a range of from 1 sccm to 500 sccm, or in a range of from 1 sccm to 400 sccm, or in a range of from 1 sccm to 300 sccm, or in a range of from 1 sccm to 200 sccm, or in a range of from 1 sccm to 150 sccm, or in a range of from 1 sccm to 50 sccm, or in a range of from 1 sccm to 40 sccm, or in a range of from 1 sccm to 30 sccm, or in a range of from 1 sccm to 20 sccm, or in a range of from 1 sccm to 10 sccm.

In one or more embodiments, the plasma treatment may occur at any suitable pressure. In one or more embodiments, the device 100 is treated with the plasma at a pressure in a range of from 0.2 mTorr to less than 500 mTorr, or in a range of from 0.2 mTorr to 400 mTorr, or in a range of from 0.2 m Torr to 300 mTorr, or in a range of from 0.2 m Torr to 250 mTorr, or in a range of from 10 mTorr to 200 mTorr, or in a range of from 10 mTorr to 100 mTorr. In some embodiments, the pressure is greater than 50 mTorr, or greater than 60 mTorr, or greater than 70 mTorr, or greater than 80 mTorr, or greater than 90 mTorr, or greater than 100 mTorr.

In one or more embodiments, the plasma treatment may occur for any suitable period of time. In one or more embodiments, the device 100 is treated with the plasma for a period of time in a range of from 2 seconds to 10 minutes, or in a range of from 2 seconds to 5 minutes, or in a range of from 2 seconds to 4.5 min, or in a range of from 2 seconds to 3 minutes, or in a range of from 2 seconds to 2 minutes, or in a range of from 2 seconds to 1 minutes.

In one or more embodiments, the plasma treatment may occur any suitable temperature. In one or more embodiments, the plasma treatment occurs at a temperature in a range of from 10° C. to 400° C., including a range of from 20° C. to 200° C. In other embodiments, the plasma treatment occurs at ambient temperature or at room temperature.

In some embodiments, the plasma gas is flowed into the processing chamber and then ignited to form a direct plasma. In some embodiments, the plasma gas is ignited outside of the processing chamber to form a remote plasma.

In one or more embodiments, the plasma treatment may occur at any suitable power. In one or more embodiments, the power is in a range of from 10 W to 2000 W, or in a range of from 100 W to 1500 W, or in a range of from 100 W to 1000 W, or in a range of from 100 W to 750 W.

The reduced metal nitride liner 106 may have any suitable thickness known to the skilled artisan. In one or more embodiments, the reduced metal nitride liner 106 has a thickness in a range of from 0.5 nm to 5 nm.

With reference to FIG. 1 and FIG. 1D, at operation 16, a low resistivity metal fill 108 is deposited in the at least one trench 101 on the reduced metal nitride liner 106 to fill the at least one trench 101.

The low resistivity metal fill 108 may comprise any suitable metal known to the skilled artisan. In one or more embodiments, the low resistivity metal fill 108 comprises one or more of tungsten (W), molybdenum (Mo), ruthenium (Ru), cobalt (Co), and aluminum (Al).

In one or more embodiments, the low resistivity metal fill 108 can be deposited by any suitable means. In some embodiments, the low resistivity metal fill 108 can be deposited by vapor deposition such as atomic layer deposition (ALD) or chemical vapor deposition (CVD).

In one or more embodiments, for W deposition, the precursor can be any suitable precursor known to the skilled artisan. In one or more embodiments, the W precursor can include, but is not limited to, tungsten (IV) chloride ($WCl_4$), tungsten (V) chloride ($W_2Cl_{10}$), tungsten fluoride (WF), tungsten hexacarbonyl ($W(CO)_6$), tungsten (VI) oxychloride ($WOCl_4$), and the like. In one or more embodiments, for Mo deposition, the precursor can be any suitable precursor known to the skilled artisan. In one or more embodiments, the Mo precursor can include, but is not limited to, molybdenum (V) chloride ($MoCl_5$), molybdenum oxytetrachloride ($MoOCl_4$), molybdenum dichloride dioxide ($MoO_2Cl_2$), molybdenum hexafluoride ($MoF_6$), molybdenum carbonyl ($Mo(CO)_6$), and the like. In one or more embodiments, for Ru deposition, the precursor can be any suitable precursor known to the skilled artisan. In one or more embodiments, the Ru precursor can include, but is not limited to, Ru (cycloheptadieny)2, Tricarbonyl(trimethylenemethane)ruthenium), (Tris-beta-diketonates) Ru, and the like. In one or more embodiments, for Co deposition, the precursor can be any suitable precursor known to the skilled artisan. In one or more embodiments, the Co precursor can include, but is not limited to, (3,3-Dimethyl-1-butyne)dicobalt hexacarbonyl (CCTBA), Bis-cyclpentadienyl cobalt, bis(methylcyclopentadienyl)Cobalt or cyclopentadienyl isopropyl acetamindinato cobalt, and the like. In one or more embodiments, for Al deposition, the precursor can be any suitable precursor known to the skilled artisan. In one or more embodiments, the Al precursor can include, but is not limited to, dimethyl aluminum hydride (DMAH), trimethylaluminum ($Al_2(CH_3)_6$), triethylaluminum ($Al_2(C_2H_5)_6$), 1-methylpyrrolidine alane ($H_3AlN(CH_3)C_4H_8$), trimethylaminealane borane, tritertbutylaluminum, aluminum hydride, dimethylethylaminealane, and the like. In one or more embodiments, the Al deposition process can be the decomposition of a single Al precursor or a combination of multiple precursors, such as aluminum chloride and aluminum hydride.

With reference to FIG. 1D, in some embodiments, the trench 101 may be filled leaving a void or seam 110. Thus, in one or more embodiments, low resistivity metal fill 108 is reflowed to close the void or seam 110.

Specifically, in one or more embodiments, an aluminum (Al) or cobalt (Co) low resistivity metal fill 108 with reflow capability grown above 400° C. is used to achieve a void free gate stack fill. In one or more embodiments, the at least one trench 101 can be filled with a combination of a liner 106 and Al low resistivity metal fill 108, or a liner 106 and W/Mo/Ru and Al/Co low resistivity metal fill 108. In one or more embodiments, the low resistivity metal fill is reflowed to form a void free low resistivity metal fill.

Figures 2, 2A, 2B, 2C, 2D:
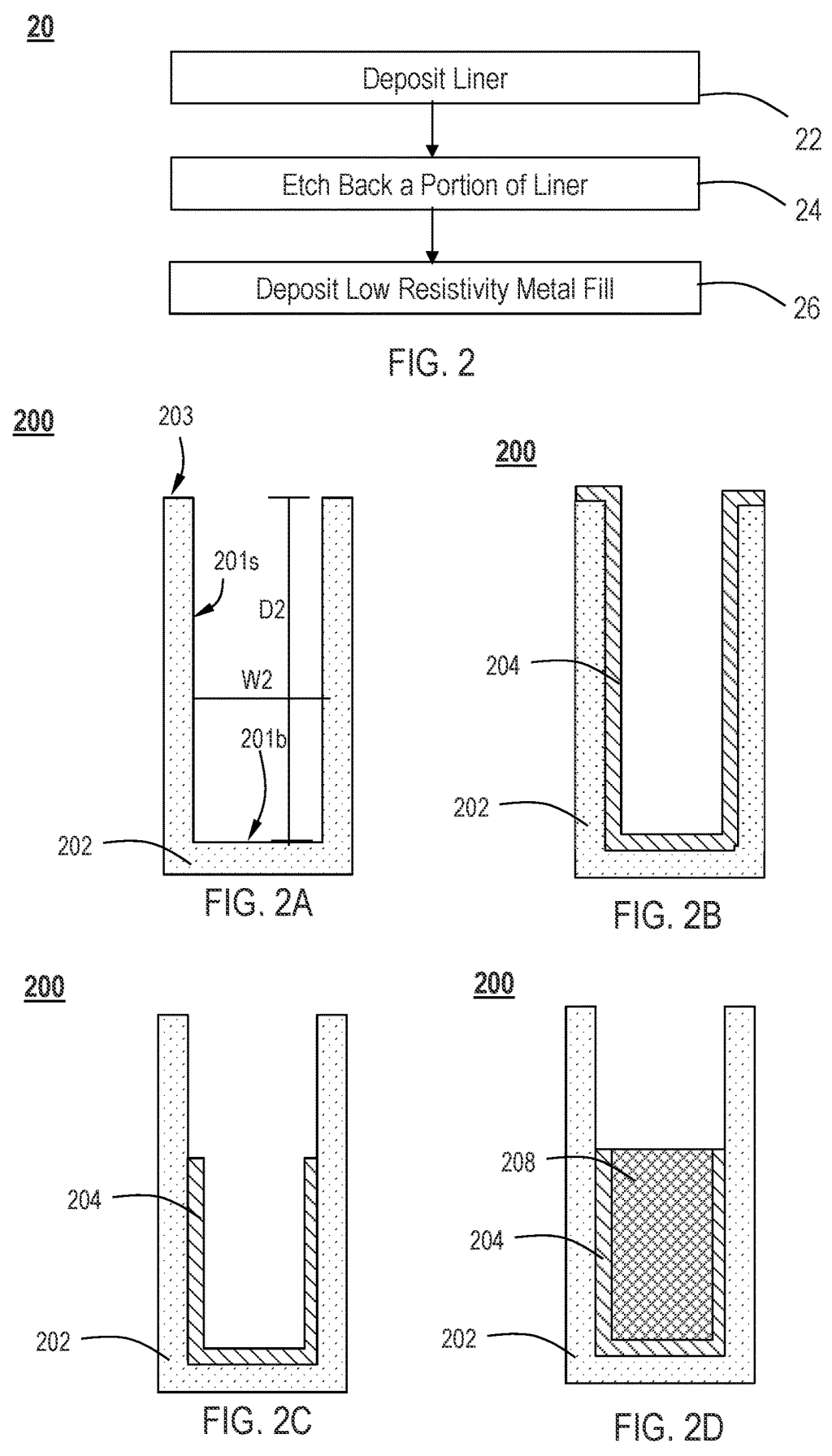

FIG. 2 depicts a process flow diagram of a method 20 of manufacturing an electronic device in accordance with one or more embodiments of the present disclosure. FIGS. 2A to 2D are cross-section views of an electronic device being processed in accordance with the method of FIG. 2. With reference to FIG. 2, the method 20 begins at operation 22 by depositing a liner on a gate stack. At operation 14, a portion of the liner is etched back. At operation 26, a low resistivity metal fill is deposited in the trench.

With reference to FIG. 2A, a substrate 202 is provided. The substrate 202 may be any suitable material known to the skilled artisan. In one or more embodiments, the substrate 202 comprises one or more of an N-dipole gate stack or a P-dipole gate stack.

The semiconductor substrate 202 can be any suitable substrate material. In one or more embodiments, the semiconductor substrate 202 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate 202 comprises one or more of silicon (Si), germanium (Ge), gallium (Ga), arsenic (As), indium (In), phosphorus (P), or selenium (Se). Although a few examples of materials from which the substrate 202 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 202 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

In one or more embodiments, the substrate 202 comprises one or more of an N-dipole gate stack or a P-dipole gate stack. The N-dipole gate stack or a P-dipole gate stack may include one or more of an interfacial layer, a high-κ dielectric layer, an N-metal layer, a P-metal layer, and a capping layer.

Referring to FIGS. 2A to 2D, a substrate 202 is provided having at least one trench 201 therein. The at least one trench has a bottom 201*b* and sidewall 201*s*. The at least one trench may be formed so as to have a width within a range of about 10 to about 100 nm, including, but not limited to a range of about 10 nm to about 80 nm, about 10 nm to about 70 nm, about 10 nm to about 60 nm, about 10 nm to about 50 nm, or about 10 nm to about 40 nm. As will be recognized by one of skill in the art, the width of the at least one trench 201 is defined by a distance W2 from one sidewall 201*s* to another sidewall 201*s*. The at least one trench 201 may be formed so as to have a depth within a range of about 120 nm to about 250 nm, including, but not limited to a range of about 120 nm to about 150 nm, about 150 nm to about 200 nm, about 200 nm to about 250 nm, about 120 nm to about 200 nm, or about 150 nm to about 250 nm. As will be recognized by one of skill in the art, the depth of the at least one trench 101 is defined by the distance D2 from the substrate surface 203 to the bottom 201*b* of the at least one trench 201.

With reference to FIG. 2 and FIG. 2B, at operation 12, a liner 204 is deposited in the at least one trench 201, on the sidewall 201*s* and on the bottom 201*b* of the at least one trench. In one or more embodiments, the liner 204 is substantially conformal. In one or more embodiments, the liner 204 is conformally deposited on a top surface, first side wall, second side wall, and bottom surface of the metal gate stack. The liner 204 may have any suitable thickness known to the skilled artisan. In one or more embodiments, the 204 has a thickness in a range of from 0.5 nm to 5 nm.

In one or more embodiments, the liner 204 may comprise any suitable material known to the skilled artisan. In one or more embodiments, the liner 204 comprises one or more of titanium nitride (TiN), titanium silicon nitride (TiSiN), titanium aluminum nitride (TiAlN), tungsten nitride (WN), molybdenum nitride (MoN), and tantalum nitride (TaN). In some embodiments, the metal nitride liner 204 further comprises an amorphous silicon (a-Si) layer.

In one or more embodiments, the liner 204 can be deposited by any suitable means. In some embodiments, the 204 can be deposited by vapor deposition such as atomic layer deposition (ALD) or chemical vapor deposition (CVD).

Referring to FIG. 2 and FIG. 2C, at operation 24, a top portion of the liner 204 on the sidewall 201$s$ is etched back to expose a sidewall 201$s$ surface of the substrate 204. In one or more embodiments, the percentage of the top portion of the liner 204 removed from the sidewall 201$s$ of the at least one trench 201 is in a range of from >0% to <70%, including in a range of from 5% to 40%, including in a range of from 5% to 30%.

With reference to FIG. 2 and FIG. 2D, at operation 26, a low resistivity metal fill 208 is deposited in the at least one trench 201 on the etched back liner 204 to fill a portion of the at least one trench 201. After selectively etching the top portion of the liner 204, a low resistivity metal fill 208 can grow only on the bottom portion of the trench 201 due to its selectivity growth on the liner 204.

The low resistivity metal fill 208 may comprise any suitable metal known to the skilled artisan. In one or more embodiments, the low resistivity metal fill 208 comprises one or more of tungsten (W), molybdenum (Mo), ruthenium (Ru), cobalt (Co), and aluminum (Al).

In one or more embodiments, the low resistivity metal fill 208 can be deposited by any suitable means. In some embodiments, the low resistivity metal fill 208 can be deposited by vapor deposition such as atomic layer deposition (ALD) or chemical vapor deposition (CVD).

In one or more embodiments, for W deposition, the precursor can be any suitable precursor known to the skilled artisan. In one or more embodiments, the W precursor can include, but is not limited to, tungsten (IV) chloride (WCl$_4$), tungsten (V) chloride (W$_2$Cl$_{10}$), tungsten fluoride (WF), tungsten hexacarbonyl (W(CO)$_6$), tungsten (VI) oxychloride (WOCl$_4$), and the like. In one or more embodiments, for Mo deposition, the precursor can be any suitable precursor known to the skilled artisan. In one or more embodiments, the Mo precursor can include, but is not limited to, molybdenum (V) chloride (MoCl$_5$), molybdenum oxytetrachloride (MoOCl$_4$), molybdenum dichloride dioxide (MoO$_2$Cl$_2$), molybdenum hexafluoride (MoF$_6$), molybdenum carbonyl (Mo(CO)$_6$), and the like. In one or more embodiments, for Ru deposition, the precursor can be any suitable precursor known to the skilled artisan. In one or more embodiments, the Ru precursor can include, but is not limited to, Ru (cycloheptadieny)2, Tricarbonyl(trimethylenemethane)ruthenium), (Tris-beta-diketonates)Ru, and the like. In one or more embodiments, for Co deposition, the precursor can be any suitable precursor known to the skilled artisan. In one or more embodiments, the Co precursor can include, but is not limited to, (3,3-Dimethyl-1-butyne)dicobalt hexacarbonyl (CCTBA), Bis-cyclopentadienyl cobalt, bis(methylcyclopentadienyl) Cobalt or cyclopentadienyl isopropyl acetamindinato cobalt, and the like. In one or more embodiments, for Al deposition, the precursor can be any suitable precursor known to the skilled artisan. In one or more embodiments, the Al precursor can include, but is not limited to, dimethyl aluminum hydride (DMAH), trimethylaluminum (Al$_2$(CH$_3$)$_6$), triethylaluminum (Al$_2$(C$_2$H$_5$)$_6$), 1-methylpyrrolidine alane (H$_3$AlN(CH$_3$)C$_4$H$_8$), trimethylaminealane borane, tritertbutylaluminum, aluminum hydride, dimethylethylaminealane, and the like. In one or more embodiments, the Al deposition process can be the decomposition of a single Al precursor or a combination of multiple precursors, such as aluminum chloride and aluminum hydride.

FIG. 3 depicts a process flow diagram of a method 30 of manufacturing an electronic device in accordance with one or more embodiments of the present disclosure. FIGS. 3A to 3D are cross-section views of an electronic device being processed in accordance with the method of FIG. 3. With reference to FIG. 3, the method 30 begins at operation 32 by depositing a liner by PVD flush on a gate stack. At operation 34, liner is selectively etched. At operation 36, a low resistivity metal fill is deposited in the trench.

With reference to FIG. 3A, a substrate 302 is provided. The substrate 302 may be any suitable material known to the skilled artisan. In one or more embodiments, the substrate 302 comprises one or more of an N-dipole gate stack or a P-dipole gate stack.

The semiconductor substrate 302 can be any suitable substrate material. In one or more embodiments, the semiconductor substrate 302 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate 302 comprises one or more of silicon (Si), germanium (Ge), gallium (Ga), arsenic (As), indium (In), phosphorus (P), or selenium (Se). Although a few examples of materials from which the substrate 302 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 302 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

In one or more embodiments, the substrate 302 comprises one or more of an N-dipole gate stack or a P-dipole gate stack. The N-dipole gate stack or a P-dipole gate stack may include one or more of an interfacial layer, a high-κ dielectric layer, an N-metal layer, a P-metal layer, and a capping layer.

Referring to FIGS. 3A to 3D, a substrate 302 is provided having at least one trench 301 therein. The at least one trench has a bottom 301*b* and sidewall 301*s*. The at least one trench 301 may be formed so as to have a width within a range of about 10 to about 100 nm, including, but not limited to a range of about 10 nm to about 80 nm, about 10 nm to about 70 nm, about 10 nm to about 60 nm, about 10 nm to about 50 nm, or about 10 nm to about 40 nm. As will be recognized by one of skill in the art, the width of the at least one trench 301 is defined by a distance W3 from one sidewall 301*s* to another sidewall 301*s*. The at least one trench 301 may be formed so as to have a depth within a range of about 120 nm to about 250 nm, including, but not limited to a range of about 120 nm to about 150 nm, about 150 nm to about 200 nm, about 200 nm to about 250 nm, about 120 nm to about 200 nm, or about 150 nm to about 250 nm. As will be recognized by one of skill in the art, the depth of the at least one trench 301 is defined by the distance D3 from the substrate surface 303 to the bottom 301*b* of the at least one trench 301.

With reference to FIG. 3 and FIG. 3B, at operation 32, a liner 304 is by PVD flush deposited in the at least one trench 301, on the sidewall 301*s* and on the top surface 303 of the at least one trench 301. In one or more embodiments, the liner 304 is substantially conformal. In one or more embodiments, the liner 304 is not formed on the sidewall 301*s* of the at least one trench 301*s* due to the directionality of PVD.

The liner 304 may have any suitable thickness known to the skilled artisan. In one or more embodiments, the liner 304 has a thickness in a range of from 0.5 nm to 5 nm.

In one or more embodiments, the liner 304 may comprise any suitable material known to the skilled artisan. In one or more embodiments, the liner 304 comprises one or more of titanium nitride (TiN), titanium silicon nitride (TiSiN), titanium aluminum nitride (TiAlN), tungsten nitride (WN), molybdenum nitride (MoN), and tantalum nitride (TaN). In some embodiments, the metal nitride liner 304 further comprises an amorphous silicon (a-Si) layer.

Referring to FIG. 3 and FIG. 3C, at operation 34, the portion of the liner 304 on the top surface 303 is selectively removed by etching, leaving only a portion of the liner 304 on the bottom surface 301*b* of the at least one trench 101.

With reference to FIG. 3 and FIG. 3D, at operation 16, a low resistivity metal fill 308 is deposited in the at least one trench 301 on the liner 304 to fill the at least one trench 301. In one or more embodiments, the low resistivity metal fill 308 is deposited by a bottom-up process. After removing the line 304 from the top surface 303, the low resistivity metal fill 308 can achieve bottom-up growth without forming a void or seam.

The low resistivity metal fill 308 may comprise any suitable metal known to the skilled artisan. In one or more embodiments, the low resistivity metal fill 308 comprises one or more of tungsten (W), molybdenum (Mo), ruthenium (Ru), cobalt (Co), and aluminum (Al).

In one or more embodiments, the low resistivity metal fill 308 can be deposited by any suitable means. In some embodiments, the low resistivity metal fill 308 can be deposited by vapor deposition such as atomic layer deposition (ALD) or chemical vapor deposition (CVD).

In one or more embodiments, for W deposition, the precursor can be any suitable precursor known to the skilled artisan. In one or more embodiments, the W precursor can include, but is not limited to, tungsten (IV) chloride (WCl$_4$), tungsten (V) chloride (W$_2$Cl$_{10}$), tungsten fluoride (WF), tungsten hexacarbonyl (W(CO)$_6$), tungsten (VI) oxychloride (WOCl$_4$), and the like. In one or more embodiments, for Mo deposition, the precursor can be any suitable precursor known to the skilled artisan. In one or more embodiments, the Mo precursor can include, but is not limited to, molybdenum (V) chloride (MoCl$_5$), molybdenum oxytetrachloride (MoOCl$_4$), molybdenum dichloride dioxide (MoO$_2$Cl$_2$), molybdenum hexafluoride (MoF$_6$), molybdenum carbonyl (Mo(CO)$_6$), and the like. In one or more embodiments, for Ru deposition, the precursor can be any suitable precursor known to the skilled artisan. In one or more embodiments, the Ru precursor can include, but is not limited to, Ru (cycloheptadieny)2, Tricarbonyl(trimethylenemethane)ruthenium), (Tris-beta-diketonates) Ru, and the like. In one or more embodiments, for Co deposition, the precursor can be any suitable precursor known to the skilled artisan. In one or more embodiments, the Co precursor can include, but is not limited to, (3,3-Dimethyl-1-butyne)dicobalt hexacarbonyl (CCTBA), Bis-cyclpentadienyl cobalt, bis(methylcyclopentadienyl)Cobalt or cyclopentadienyl isopropyl acetamindinato cobalt, and the like. In one or more embodiments, for Al deposition, the precursor can be any suitable precursor known to the skilled artisan. In one or more embodiments, the Al precursor can include, but is not limited to, dimethyl aluminum hydride (DMAH), trimethylaluminum (Al$_2$(CH$_3$)$_6$), triethylaluminum (Al$_2$(C$_2$H$_5$)$_6$), 1-methylpyrrolidine alane (H$_3$AlN(CH$_3$)C$_4$H$_8$), trimethylaminealane borane, tritertbutylaluminum, aluminum hydride, dimethylethylaminealane, and the like. In one or more embodiments, the Al deposition process can be the decomposition of a single Al precursor or a combination of multiple precursors, such as aluminum chloride and aluminum hydride.

Figure 4:
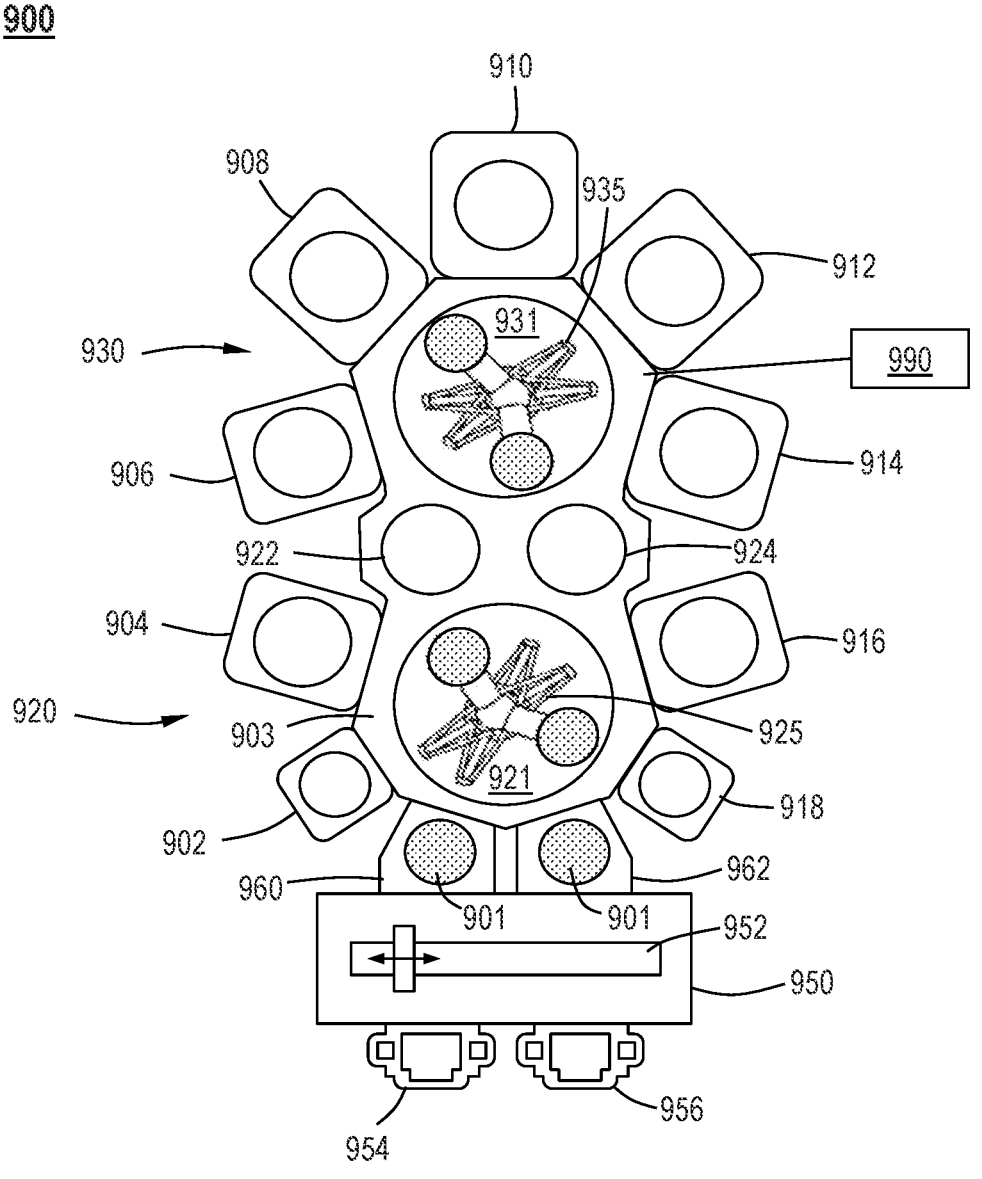
FIG. 4 illustrates a schematic top-view diagram of an example multi-chamber processing system in accordance with one or more embodiments of the disclosure.

Additional embodiments of the disclosure are directed to processing tools (i.e., a cluster tool) 900 for the formation of the logic/memory devices and methods described, as shown in FIG. 4. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station 921, 931. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a thermal processing (RTP) chamber, a plasma oxidation chamber, a plasma nitridation chamber, and an atomic layer deposition (ALD) chamber. The particular arrangement of process chambers and components can be varied depending on the cluster tool and should not be taken as limiting the scope of the disclosure.

In one or more embodiments, the cluster tool 900 includes liner deposition chamber to deposit a metal nitride liner. The liner deposition chamber of some embodiments comprises an atomic layer deposition chamber, a plasma enhanced atomic layer deposition chamber, or a spatial atomic layer deposition chamber. In one or more embodiments, the cluster tool 900 includes a PVD deposition chamber connected to the central transfer station to deposit the metal nitride liner.

In one or more embodiments, the cluster tool 900 includes a low resistivity metal deposition chamber to deposit a low resistivity metal fill. The low resistivity metal deposition chamber of some embodiments comprises an atomic layer deposition chamber, a plasma enhanced atomic layer deposition chamber, or a spatial atomic layer deposition chamber.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown in FIG. 4 has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or to allow water cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In one or more embodiments, the controller causes the processing chamber to perform the operations of methods 10, 20, and/or 30. In one or more embodiments, the controller causes the processing chamber to perform the operations of depositing a metal nitride liner on a substrate (operation 12). In one or more embodiments, the controller causes the processing chamber to perform the operation of treating the liner with a plasma to reduce the liner (operation 14) and depositing a low resistivity metal fill in the trench of the substrate (operation 16).

In one or more embodiments, the processing tool 900 comprises a central transfer station 921, 931 comprising at least one robot 925, 935 configured to move a wafer; one or more of an atomic layer deposition station (ALD), a chemical vapor deposition (CVD) station, and a physical vapor deposition (PVD) station connected to the central transfer station; an etching station connected to the central transfer station; and an optional pre-clean station connected to the central transfer station; and at least one controller connected to the one or more of the central transfer station, one or more of an atomic layer deposition station (ALD), a chemical vapor deposition (CVD) station, and a physical vapor deposition (PVD) station, an etching station, or the optional pre-clean station. In one or more embodiments, the at least one controller has at least one configuration selected from: deposit a liner, treat liner with plasma, etch liner, selectively etch liner, and deposit a fill material.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of reducing gate resistance in an NMOS device, the method comprising:

conformally depositing a metal nitride layer and an amorphous silicon (a-Si) layer on a P-metal layer of a metal gate stack, the metal gate stack comprising the P-metal layer on one or more of an N-metal layer, a high-K dielectric layer, and an interfacial layer on a channel, the metal nitride layer comprising one or more of titanium nitride (TiN), titanium silicon nitride (TiSiN), titanium aluminum nitride (TiAlN), tungsten nitride (WN), molybdenum nitride (MoN), or tantalum nitride TaN);

treating the metal nitride layer with a plasma comprising one or more of argon (Ar), nitrogen ($N_2$), or hydrogen ($H_2$) to reduce nitrogen content in the metal nitride layer and form a reduced metal nitride layer; and depositing a low resistivity metal fill on the reduced metal nitride layer, the low resistivity metal fill comprising one or more of tungsten (W), molybdenum (Mo), ruthenium (Ru), cobalt (Co), and aluminum (Al).

2. The method of claim 1, wherein the metal nitride layer comprises one or more of titanium silicon nitride (TiSiN) and molybdenum nitride (MoN).

3. The method of claim 1, wherein the low resistivity metal fill comprises one or more of molybdenum (Mo), ruthenium (Ru), and cobalt (Co).

4. The method of claim 1, wherein the low resistivity metal fill is deposited by atomic layer deposition or chemical vapor deposition with a precursor selected from the group consisting of tungsten (IV) chloride, tungsten (V) chloride, tungsten fluoride, tungsten hexacarbonyl, tungsten (VI) oxychloride, to $MoCl_5$, $MoOCl_4$, $MoO_2Cl_2$, $MoF_6$, $Mo(CO)_6$, Ru (cycloheptadieny)2, Tricarbonyl (trimethylenemethane) ruthenium), (Tris-beta-diketonates)ruthenium, (3,3-Dimethyl-1-butyne) dicobalt hexacarbonyl (CCTBA), Bis-cyclpentadienyl cobalt, bis(methylcyclopentadienyl) Cobalt or cyclopentadienyl isopropyl acetamindinato cobalt, Aluminum hydride, trimethylaluminum, triethylaluminum, 1-methylpyrolidine Alane, trimethylaminealane Borane, tritertbutylaluminum, and dimethylethylaminealane.

5. The method of claim 1, further comprising reflowing the low resistivity metal fill to form a void free low resistivity metal fill.

6. The method of claim 1, wherein the metal gate stack comprises a P-dipole or an N-dipole.

7. The method of claim 1, wherein the metal nitride layer and the amorphous silicon (a-Si) layer are deposited in at least one trench, the at least one trench having a width in a range of from about 10 to about 100 nm and a depth in a range of from about 120 nm to about 250 nm.

8. The method of claim 7, wherein the low resistivity metal fill is deposited on the reduced metal nitride layer to fill the at least one trench.

9. The method of claim 1, wherein the metal nitride layer is deposited to a thickness in a range of from 0.5 nm to 5 nm.

10. The method of claim 1, wherein the plasma consists essentially of nitrogen ($N_2$).

11. The method of claim 1, wherein the metal nitride layer is treated with the plasma at a temperature of from 10° C. to 400° C. and a pressure of from 0.2 mTorr to 500 m Torr.

12. The method of claim 1, wherein the metal nitride layer is treated with the plasma at a flow rate in a range of from 1 sccm to 1000 sccm and a power in a range of from 100 W to 1500 W for a period of from 2 seconds to 10 minutes.

13. The method of claim 5, comprising reflowing the low resistivity metal fill at a temperature of greater than 400° C.

14. The method of claim 1, wherein the low resistivity metal fill comprises aluminum (Al) and is deposited by atomic layer deposition or chemical vapor deposition with a combination of aluminum chloride and aluminum hydride precursors.

* * * * *